United States Patent
Critcher et al.

(10) Patent No.: US 11,774,529 B2
(45) Date of Patent: Oct. 3, 2023

(54) GRADIENT COOLING MANIFOLD ASSEMBLY HAVING ADDITIVELY MANUFACTURED MANIFOLDS

(71) Applicant: GE PRECISION HEALTHCARE LLC, Wauwatosa, WI (US)

(72) Inventors: Charles Bradford Critcher, Florence, SC (US); Robert Alan Irion, Florence, SC (US)

(73) Assignee: GE PRECISION HEALTHCARE LLC, Wauwatosa, WI (US)

( * ) Notice: Subject to any disclaimer, the term of this patent is extended or adjusted under 35 U.S.C. 154(b) by 70 days.

(21) Appl. No.: 17/531,009

(22) Filed: Nov. 19, 2021

(65) Prior Publication Data

US 2023/0160984 A1    May 25, 2023

(51) Int. Cl.
*G01R 33/385* (2006.01)
*B33Y 80/00* (2015.01)

(52) U.S. Cl.
CPC .......... *G01R 33/3856* (2013.01); *B33Y 80/00* (2014.12)

(58) Field of Classification Search
CPC ............ G01R 33/3856; G01R 33/3858; G01R 33/283; G01R 33/3802
See application file for complete search history.

(56) References Cited

U.S. PATENT DOCUMENTS

| 10,761,162 | B2 | 9/2020 | Thiagarajan et al. | |
| 2001/0042385 | A1* | 11/2001 | Kaindl | F28D 7/0041 62/436 |
| 2006/0066309 | A1* | 3/2006 | Arik | G01R 33/3856 324/318 |

FOREIGN PATENT DOCUMENTS

| DE | 10214918 A1 * | 11/2003 | ......... G01R 33/3856 |
| WO | WO-2014133185 A1 * | 9/2014 | ......... G01R 33/3815 |

OTHER PUBLICATIONS

What is Additive Manufacturing, available Oct. 24, 2020 at https://www.ge.com/additive/additive-manufacturing (Year: 2020).*
Everything You Need to Know about Creating a Secure Hose Barb Connection, Sep. 2, 2021, available at https://www.qosina.com/everything-you-need-to-know-about-creating-a-secure-hose-barb-connection#gref (Year: 2021).*
Uxcell Tee Brass Barb Fitting Reducer Y Shape 3 Way Fit Hose ID 10×6×6mm, first available for purchase on Nov. 1, 2019, downloaded from https://www.amazon.com/uxcell-10x6x6mm-Reducer-Y-Shaped-Connector/dp/B07ZVMBJ5H?th=1 on Mar. 24, 2023 (Year: 2019).*
⅜ Barb Straight Manifold With (4) ¼ Barb Outlets SS, available from Apex Beverage Equipment Distribution at https://web.archive.org/web/20210729173447/https:/www.totalapex.com/beverage-system-fittings/ss-and-nickel-plated/c85_86/ on Jul. 29, 2021 (Year: 2021).*

(Continued)

*Primary Examiner* — Daniel R Miller
(74) *Attorney, Agent, or Firm* — Fletcher Yoder, P.C.

(57) ABSTRACT

A manifold for a gradient coil cooling manifold assembly of a MRI system includes a first main fluid passage defined by a first wall. The manifold also includes a first set of secondary fluid passages coupled to the first main fluid passage and defined by respective walls, wherein the first wall of the first main fluid passage and the respective walls of the first set of secondary fluid passages form barb connectors configured to couple to respective hoses. The manifold is formed as a single integral piece.

8 Claims, 9 Drawing Sheets

(56) References Cited

OTHER PUBLICATIONS

Metaland Stainless Steel ⅜" Hose Barb Elbow 90 Degree L Right Angle Barbed Fitting Water Fuel Air, accessed Jul. 7, 2023 at https://www.amazon.com, product first available on Amazon on Mar. 24, 2021 (Year: 2021).*

Watts Brass & Tubular P-10Port 10 Port QC Manifold, accessed Jun. 26, 2023 at https://www.amazon.com/WATTS-BRASS-TUBULAR-P-10PORT-Manifold/dp/B001UL8J6K, with product first available on Amazon on Mar. 4, 2009 (Year: 2009).*

Seal Fast 2019 Catalog (2019), available at https://www.sealfast.com/view-seal-fast-inc-2019-catalog/, p. 125 (Year: 2019).*

* cited by examiner

GRADIENT COOLING MANIFOLD ASSEMBLY HAVING ADDITIVELY MANUFACTURED MANIFOLDS

BACKGROUND

The subject matter disclosed herein relates to a magnetic resonance imaging (MRI) system and, more particularly, to a gradient cooling manifold assembly having additively manufactured manifolds.

Non-invasive imaging technologies allow images of the internal structures or features of a patient/object to be obtained without performing an invasive procedure on the patient/object. In particular, such non-invasive imaging technologies rely on various physical principles (such as the differential transmission of X-rays through a target volume, the reflection of acoustic waves within the volume, the paramagnetic properties of different tissues and materials within the volume, the breakdown of targeted radionuclides within the body, and so forth) to acquire data and to construct images or otherwise represent the observed internal features of the patient/object.

During MRI, when a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field B1) which is in the x-y plane and which is near the Larmor frequency, the net aligned moment, or "longitudinal magnetization", $M_z$, may be rotated, or "tipped", into the x-y plane to produce a net transverse magnetic moment, $M_t$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradient fields vary according to the particular localization method being used. The resulting set of received nuclear magnetic resonance (NMR) signals are digitized and processed to reconstruct the image using one of many well-known reconstruction techniques.

The magnetic field gradients are generated by gradient field coils in a gradient coil assembly. The gradient coil assembly generates heat during imaging (e.g., due to eddy currents and resistive heating). Different types of cooling (e.g., fluidic cooling) are typically utilized to minimize heating of the gradient coil assembly. However, as the bore of MRI systems increase, minimizing the heating of the gradient coil assembly becomes more challenging. In addition, manifold assemblies for providing the fluid to cool the gradient coil assembly are costly, occupy a large footprint, and are subject to a higher risk of mechanical failure (e.g., due to the number of connections and the system demands on the manifold assemblies).

BRIEF DESCRIPTION

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In one embodiment, a manifold for a gradient coil cooling manifold assembly of a MRI system is provided. The manifold includes a first main fluid passage defined by a first wall. The manifold also includes a first set of secondary fluid passages coupled to the first main fluid passage and defined by respective walls, wherein the first wall of the first main fluid passage and the respective walls of the first set of secondary fluid passages form barb connectors configured to couple to respective hoses. The manifold is formed as a single integral piece.

In one embodiment, a gradient coil cooling manifold assembly of a MRI system includes a plurality of hoses. The gradient coil cooling manifold assembly also includes a plurality of additively manufactured manifolds coupled to the plurality of hoses. Each additively manufactured manifold of the plurality of additively manufactured manifolds includes a main fluid passage defined by a wall. Each additively manufactured manifold of the plurality of additively manufactured manifolds also includes a set of secondary fluid passages coupled to the main fluid passage and defined by respective walls. The wall of the main fluid passage and the respective walls of the set of secondary fluid passages form barb connectors configured to couple to respective hoses of the plurality of hoses.

In one embodiment, a MRI system is provided. The MRI system includes a gradient coil assembly including a plurality of gradient coils. The MRI system also includes a gradient coil cooling manifold assembly configured to couple to the gradient coil assembly and to regulate a temperature of the gradient coil assembly. The gradient coil cooling manifold assembly includes a plurality of manifolds. Each manifold of the plurality of manifolds includes a main fluid passage defined by a wall. Each manifold of the plurality of manifolds also includes a set of secondary fluid passages coupled to the main fluid passage and defined by respective walls. The wall of the main fluid passage and the respective walls of the set of secondary fluid passages form barb connectors configured to couple to respective hoses. Each manifold of the plurality of manifolds is formed as a single integral piece.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
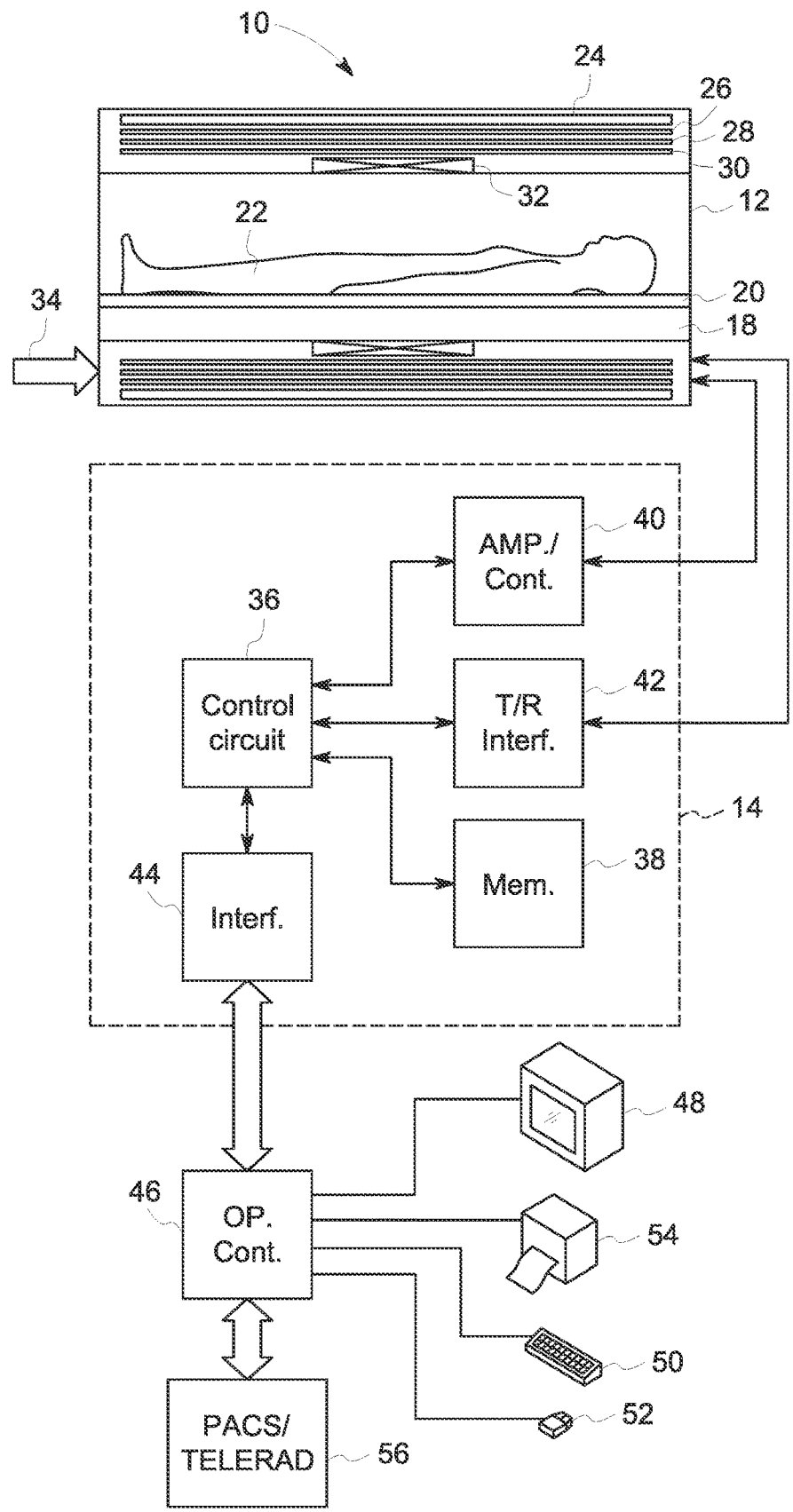
FIG. 1 illustrates an embodiment of a magnetic resonance imaging (MRI) system suitable for use with the disclosed technique.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present subject matter, the articles "a," "an," "the," and "said" are intended to mean that there are one or more of the elements. The terms "comprising," "including," and "having" are intended to be inclusive and mean that there may be additional elements other than the listed elements. Furthermore, any numerical examples in the following discussion are intended to be non-limiting, and thus additional numerical values, ranges, and percentages are within the scope of the disclosed embodiments.

While aspects of the following discussion are provided in the context of medical imaging, it should be appreciated that the disclosed techniques are not limited to such medical contexts. Indeed, the provision of examples and explanations in such a medical context is only to facilitate explanation by providing instances of real-world implementations and applications. However, the disclosed techniques may also be utilized in other contexts, such as image reconstruction for non-destructive inspection of manufactured parts or goods (i.e., quality control or quality review applications), and/or the non-invasive inspection of packages, boxes, luggage, and so forth (i.e., security or screening applications). In general, the disclosed techniques may be useful in any imaging or screening context or image processing or photography field where a set or type of acquired data undergoes a reconstruction process to generate an image or volume.

Manifold assemblies for providing fluid to cool gradient coil assemblies of MRI systems are costly, occupy a large footprint, and are subject to a higher risk of mechanical failure (e.g., due to the number of connections and the system demands on the manifold assemblies). Manufacturing manifold assemblies to meet the system demands for cooling gradient coil assemblies is difficult. Traditional fabrication techniques are insufficient. For example, copper welded/braze assemblies are too bulky and rigid and, thus, prone to damage. In addition, the cost of a welded assembly is a burden. A machined block style manifold takes up too much space and is too heavy. In addition, the machined block style includes numerous connections or joints, which increase the amount of potential leak paths. Casting necessitates complex and costly tooling, which limits design iteration.

The present disclosure provides a gradient cooling manifold assembly for a MRI system that includes one or more additively manufactured (e.g., via direct metal laser sintering) manifolds or manifold modules coupled to flexible rubber hosing. Each manifold module includes at least one main or primary fluid passage (e.g., inlet or outlet) defined by a first wall and a set of secondary fluid passages coupled to the main passage and defined by respective walls. The wall of at least one main fluid passage and the respective walls of the set of secondary fluid passages form barb connectors or fittings configured to couple to respective hoses. In certain embodiments, each manifold module includes two main or primary fluid passages defined by a first wall and a second wall (e.g. physically coupled via one or more structural ribs extending between the first and second walls) with each main fluid passage coupled to a respective set of secondary fluid passages having respective walls that form barb connectors. The one or more main fluid passages and the one or more sets of primary fluid passages of the manifold module are formed as a single integral piece.

Additive manufacturing's ability to quickly print complex geometries enables the manifold modules to be optimized to produce maximum flow with minimal volumetric space, efficient fabrication, assembly, and service ability. Critical space (e.g., axial space between the manifold assembly and the gradient coil assembly) is saved by matching the module's mainline geometry to that of the gradient coil's circular shape and targeting the branches to their destination. Fabricating this complex geometry would be substantially more difficult with traditional module fabrication techniques. Additive manufacturing allows combining otherwise separate components into a single part enable to withstand the system parameters for cooling a gradient coil assembly of a MRI system. The disclosed embodiments enable less connections in the manifold assembly, thus, lowering the risk of leaks. In addition, less braze joints/fittings enables a lower risk of mechanical failure in the manifold assembly. Further, the custom precise geometry enables better cooling with fewer failures. Even further, the disclosed embodiments enable a lower cost manifold assembly.

Turning now to the drawings, and referring first to FIG. 1, a magnetic resonance imaging (MRI) system 10 is illustrated diagrammatically as including a scanner 12, scanner control circuitry 14, and system control circuitry 16. While MRI system 10 may include any suitable MRI scanner or detector, in the illustrated embodiment the system includes a full body scanner comprising a patient bore 18 into which a table 20 may be positioned to place a patient 22 in a desired position for scanning.

Scanner 12 includes a series of associated coils for producing controlled magnetic fields, for generating radiofrequency excitation pulses, and for detecting emissions from gyromagnetic material within the patient in response to such pulses. In the diagrammatical view of FIG. 1, a primary magnet coil 24 (e.g., superconducting magnet coil) is provided for generating a primary magnetic field, $B_0$, generally aligned with patient bore 18. In certain embodiments, $B_0$ fields on the order of 3T to 7T are contemplated, but fields higher than 7T and as low as a fraction of a Tesla are also contemplated. A series of gradient coils 26, 28 and 30 (e.g., magnetic gradient field coils) are grouped in a coil assembly (e.g., gradient coil assembly) for generating controlled magnetic gradient fields during examination sequences as described more fully below. A radiofrequency coil 32 is provided for generating radiofrequency pulses for exciting the gyromagnetic material. In the embodiment illustrated in FIG. 1, coil 32 also serves as a receiving coil. Thus, radiofrequency (RF) coil 32 may be coupled with driving and receiving circuitry in passive and active modes for receiving emissions from the gyromagnetic material and for applying radiofrequency excitation pulses, respectively. Alternatively, various configurations of receiving coils may be provided separate from RF coil 32. Such coils may include structures specifically adapted for target anatomies, such as head coil assemblies, and so forth. Moreover, receiving coils may be provided in any suitable physical configuration, including phased array coils, and so forth.

In a present configuration, the magnet gradient field coils 26, 28 and 30 have different physical configurations adapted to their function in the imaging system 10. As will be appreciated by those skilled in the art, the coils are comprised of conductive wires, bars or plates which are wound or cut to form a coil structure which generates a gradient field upon application of control pulses as described below. The placement of the coils within the gradient coil assembly may be done in several different orders, but in the present embodiment, a Z-axis coil is positioned at an innermost location, and is formed generally as a solenoid-like structure which has relatively little impact on the RF magnetic field. Thus, in the illustrated embodiment, gradient coil 30 is the Z-axis solenoid coil, while coils 26 and 28 are the transverse Y-axis and X-axis coils, respectively.

The coils of scanner 12 are controlled by external circuitry to generate desired fields and pulses, and to read signals in a controlled manner. As will be appreciated by those skilled in the art, when the material, typically bound in tissues of the patient, is subjected to the primary field, magnetic moments of the nuclei in the tissue partially align with the field. While a net magnetic moment is produced in the direction of the polarizing field, the randomly oriented components of the moment in a perpendicular plane generally cancel one another. During an examination sequence, an RF frequency pulse is generated at or near the Larmor frequency of the material of interest, resulting in rotation of the net aligned moment to produce a net transverse magnetic moment. This transverse magnetic moment precesses around the main magnetic field direction, emitting RF signals that are detected by the scanner and processed for reconstruction of the desired image.

Gradient coils 26, 28 and 30 serve to generate precisely controlled magnetic fields, the strength of which vary over a predefined field of view, typically with positive and negative polarity. When each coil is energized with known electric current, the resulting magnetic field gradient is superimposed over the primary field and produces a desirably linear variation in the Z-axis component of the magnetic field strength across the field of view. The gradient coil for each axis generates a linear magnetic field gradient in the direction of that axis. As such, the spatially-varying z-directed magnetic field varies linearly along the direction of the gradient coil axis. The three coils have mutually orthogonal axes for the direction of their variation, enabling a linear field gradient to be imposed in an arbitrary direction with an appropriate combination of the three gradient coils.

The pulsed gradient fields perform various functions integral to the imaging process. Some of these functions are slice selection, frequency encoding and phase encoding. These functions can be applied along the X-, Y- and Z-axis of the original coordinate system or along other axes determined by combinations of pulsed currents applied to the individual field coils.

The slice select gradient determines a slab or cross-section of tissue or anatomy to be imaged in the patient. The slice select gradient field may be applied simultaneously with a frequency selective RF pulse to excite a known volume of spins within a desired slice that precess at the frequencies equal to the excitation bandwidth of the RF pulse. The slice thickness is determined by the bandwidth of the RF pulse and the gradient strength across the field of view.

The frequency encoding gradient is also known as the readout gradient and is usually applied in a direction perpendicular to the slice select gradient. The frequency encoding gradient encodes positional information of spins with the plane excited by the RF pulse. In general, the frequency encoding gradient waveforms comprises of a dephasing lobe that dephases the spins, and a readout gradient lobe that rephases the spins at the center of the readout gradient waveform to form an echo. Spins with a nuclear magnetic moment encoded with a spatially varying phase (as they precess at different frequencies) according to their spatial position along the gradient field. By Fourier transformation, acquired signals may be analyzed to identify their location in the selected slice by virtue of the frequency encoding.

Finally, the phase encode gradient is generally applied before the readout gradient and after the slice select gradient. Localization of spins in the gyromagnetic material in the phase encode direction is accomplished by sequentially inducing variations in phase of the precessing protons of the material using slightly different gradient amplitudes that are sequentially applied during the data acquisition sequence. The phase encode gradient permits phase differences to be created among the spins of the material in accordance with their position in the phase encode direction, similar in principle to the phase accumulated by spins in the readout gradient waveform at different time points.

As will be appreciated by those skilled in the art, a great number of variations may be devised for pulse sequences employing the exemplary gradient pulse functions described above as well as other gradient pulse functions not explicitly described here. Moreover, adaptations in the pulse sequences may be made to appropriately orient both the selected slice and the frequency and phase encoding to excite the desired material and to acquire resulting MR signals for processing.

The coils of scanner 12 are controlled by scanner control circuitry 14 to generate the desired magnetic field and radiofrequency pulses. In the diagrammatical view of FIG. 1, control circuitry 14 thus includes a control circuit 36 for commanding the pulse sequences employed during the examinations, and for processing received signals. Control circuit 36 may include any suitable programmable logic device, such as a CPU or digital signal processor of a general purpose or application-specific computer. Control circuit 36 further includes memory circuitry 38, such as volatile and non-volatile memory devices for storing physical and logical axis configuration parameters, examination pulse sequence descriptions, acquired image data, programming routines, and so forth, used during the examination sequences implemented by the scanner.

Interface between the control circuit 36 and the coils of scanner 12 is managed by amplification and control circuitry 40 and by transmission and receive interface circuitry 42. Circuitry 40 includes amplifiers for each gradient field coil to supply drive current to the field coils in response to control signals from control circuit 36. Interface circuitry 42 includes additional amplification circuitry for driving RF coil 32. Moreover, where the RF coil serves both to emit the radiofrequency excitation pulses and to receive MR signals, circuitry 42 will typically include a switching device for toggling the RF coil between active or transmitting mode, and passive or receiving mode. A power supply, denoted generally by reference numeral 34 in FIG. 1, is provided for energizing the primary magnet 24. Finally, circuitry 14 includes interface components 44 for exchanging configuration and image data with system control circuitry 16. It should be noted that, while in the present description reference is made to a horizontal cylindrical bore imaging system employing a superconducting primary field magnet assembly, the present technique may be applied to various other configurations, such as scanners employing vertical fields generated by superconducting magnets, permanent magnets, electromagnets or combinations of these means.

System control circuitry 16 may include a wide range of devices for facilitating interface between an operator or radiologist and scanner 12 via scanner control circuitry 14. In the illustrated embodiment, for example, an operator controller 46 is provided in the form of a computer workstation employing a general purpose or application-specific computer. The station also typically includes memory circuitry for storing examination pulse sequence descriptions, examination protocols, user and patient data, image data, both raw and processed, and so forth. The station may further include various interface and peripheral drivers for receiving and exchanging data with local and remote devices. In the illustrated embodiment, such devices include a conventional computer keyboard 50 and an alternative input device such as a mouse 52. A printer 54 is provided for generating hard copy output of documents and images reconstructed from the acquired data. A computer monitor 48 is provided for facilitating operator interface. In addition, system 10 may include various local and remote image access and examination control devices, represented generally by reference numeral 56 in FIG. 1. Such devices may include picture archiving and communication systems, teleradiology systems, and the like.

Figure 2:
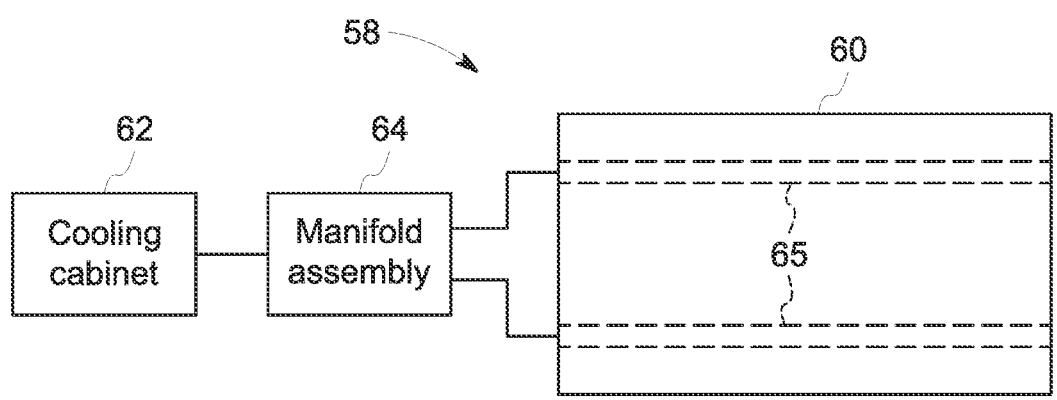
FIG. 2 is a schematic view of an embodiment of a cooling system coupled to a gradient coil assembly of the MRI system of FIG. 1, in accordance with aspects of the present disclosure.

FIG. 2 is schematic view of an embodiment of a cooling system 58 (e.g., thermal management system) coupled to a gradient coil assembly 60 (e.g., having the gradient coils 26, 28, 30 of FIG. 1) of the MRI system 10 of FIG. 1. The cooling system 58 includes a cooling cabinet 62 coupled to a manifold assembly 64 (e.g., flexible gradient coil cooling manifold assembly). The cooling cabinet 62 provides liquid coolant (e.g., de-ionized water, ethylene glycol, etc.) to the manifold assembly 64. The manifold assembly 64 (via supply lines) provides the liquid coolant to cooling circuits 65 (e.g., jackets, tubes, channels, etc.) disposed within the gradient coil assembly 60 to manage the temperature of the gradient coils (e.g., cool the gradient coils). The structure of the cooling circuits 65 may vary based on the gradient structure of the gradient coil assembly 60 and associated gradient coils. After flowing through the cooling circuits 65, the liquid coolant is returned to the cooling cabinet 62 via the manifold assembly 64. The cooling cabinet 62 may include a heat exchanger to regulate a temperature of the liquid coolant. As described in greater detail below, the manifold assembly 64 includes one or more additively manufactured manifolds or manifold modules.

Figure 3:
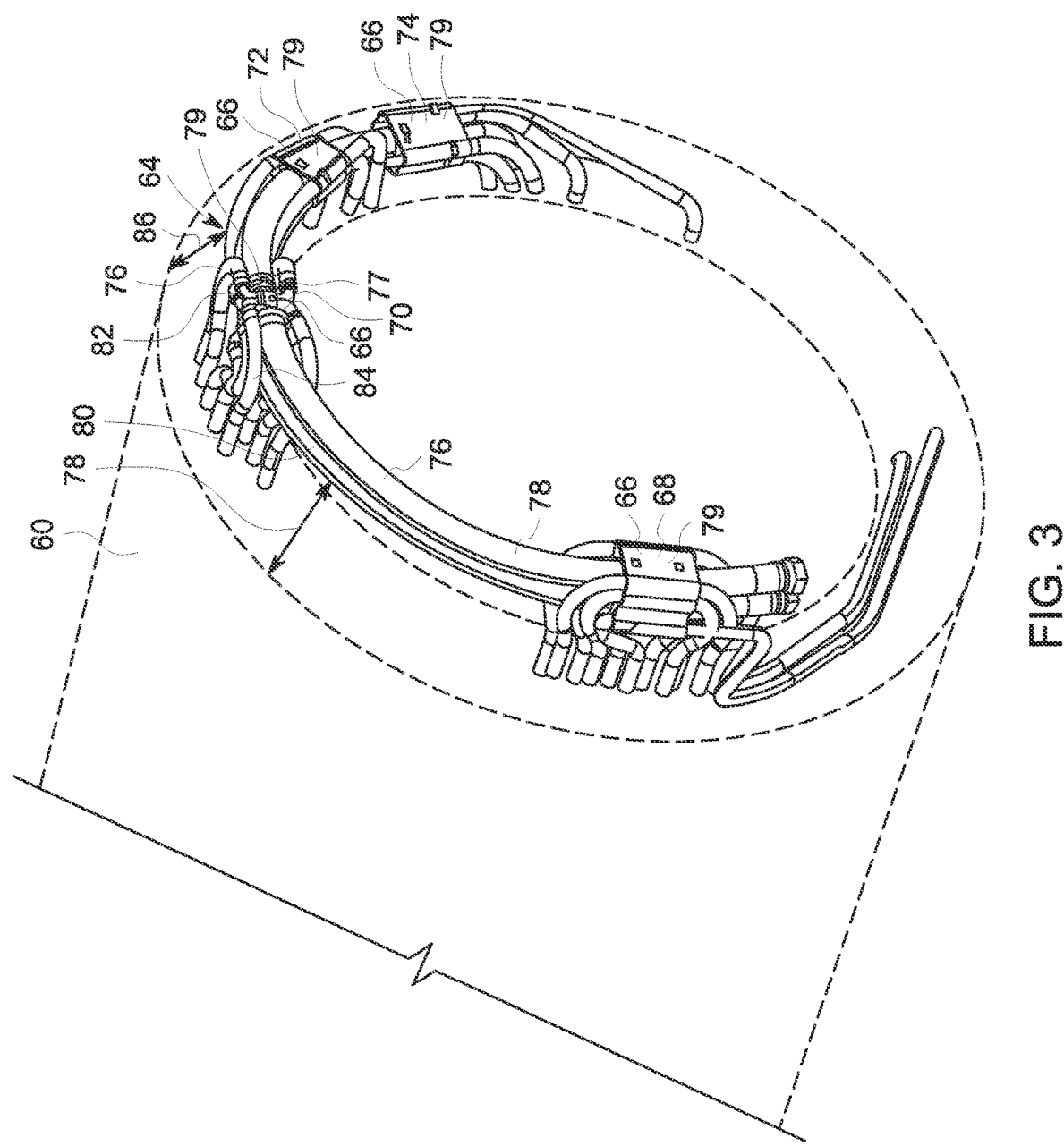
FIG. 3 is a perspective view of an embodiment of a gradient coil cooling manifold assembly coupled to a gradient coil assembly, in accordance with aspects of the present disclosure.
Figure 4:
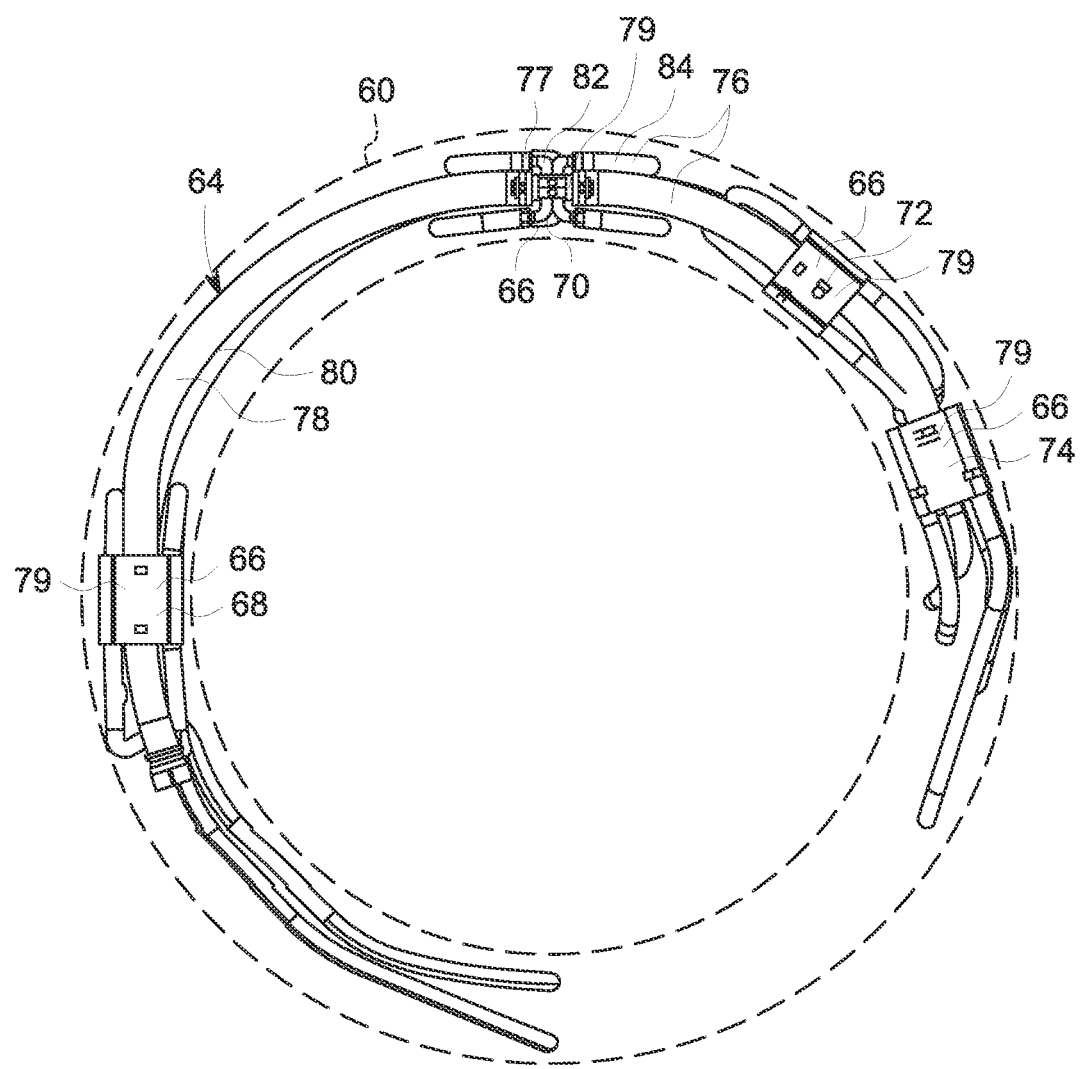
FIG. 4 is front view of the gradient coil cooling manifold assembly of FIG. 3 coupled to the gradient coil assembly, in accordance with aspects of the present disclosure.

FIGS. 3 and 4 are perspective views of the gradient coil cooling manifold assembly 64 coupled to the gradient coil assembly 60 (shown in dashed outline). The manifold assembly 64 includes a plurality of additively manufactured manifold modules or manifolds 66 (e.g., manifolds 68, 70, 72, 74) plumbed together by flexible rubber hoses 76 and secured by clamps 77. Although 4 manifolds 66 are depicted as part of the manifold assembly 64, the number of manifolds 66 may vary (e.g., 1, 2, 3, 4, 5, etc.).

The rubber hoses 76 include a main supply line 78 and a main return line 80 for the liquid coolant. Each manifold 66 includes a main or primary fluid passage 79 coupled to either the main supply line 78 or the main return line 80. In certain embodiments, one or more modules 66 may include two separate main or primary fluid passages 79 coupled to the main supply line 78 and the main return line 80, respectively. For example, the manifolds 68 and 70 each include two main fluid passages 79 coupled to the main supply line 78 and the main return line 80, respectively. The manifold 72 includes a single main fluid passage 79 coupled to the main return line 80. The manifold 74 includes a single main fluid passage 79 coupled to the main supply line 78. The integration of two main fluid passages 79 (e.g., supply and return passages) within a single module for both of the manifolds 68 and 70 simplifies the design, reduces leak paths, and saves space. In addition, the respective walls defining two main fluid passages 79 for each of the manifolds 68 and 70 may be coupled together via one or more structural ribs extending between the walls, thus, imparting more strength into the individual modules to enable them to act as mounting features between the gradient coil assembly 60 and the gradient coil cooling manifold assembly 64.

Each manifold 66 includes at least one set of secondary fluid passages 82 coupled to the main fluid passage 79. In certain embodiments, one or more modules 66 may include at least one set of secondary fluid passages 82 coupled to each of the two separate main or primary fluid passages 79 of the module 66. The number of secondary fluid passages 82 in each set may vary (e.g., 2, 3, 4, 5, 6, 7, 8, 9, 10, 11, 12, etc.). The secondary fluid passages 82 are coupled to secondary hoses 84 of the rubber hoses 76. The secondary hoses 84 are coupled to either inlets or outlets of cooling circuits of the gradient coil assembly 60. For example the manifolds 68 and 70 include two or more sets of secondary fluid passages 82. The manifolds 72 and 74 include a single set of secondary fluid passages 82. An inner diameter of the respective wall of each main fluid passage 79 is greater than respective diameters of the respective walls of each secondary fluid passage 82 coupled to the respective main fluid passage 79.

The respective walls (outer surfaces of the walls) of the one or more main fluid passages 79 and the secondary fluid passages 82 form barbed connectors or fittings. Each barb connector enables interface with the rubber hose 76 and the ability to retain pressurized fluid (e.g. water) via leak-tight connection. A combination of the orientation of the barbs on the outer surface of the barbed connectors and post-processing (e.g., via a vibratory finisher) after additive manufacturing enables the outer surface of the barbed connectors to be leak tight up to pressures of at least approximately 450 psi (3102 kPa) (which is 3× burst pressure of a pressure of approximately 150 psi (1034 kPa)).

As noted above, the manifolds 66 are additively manufactured. In particular, the manifolds 66 may be formed as single piece modules via direct metal laser sintering. The manifolds 66 may be made of a non-ferrous metal (non-magnetized metal) that can hold the necessary pressure (e.g., 450 psi (3102 kPa)). In certain embodiments, the manifolds 66 are made of stainless steel. In other embodiments, the manifolds 66 are made of aluminum. After being additively manufactured, the modules may be subject to post-processing. For example, a vibratory finisher may be utilized to optimize the outer surface of barb connectors on walls defining the secondary fluid passages 82.

The modular design of the gradient coil cooling manifold assembly 64 provides many options in both manufacturing and service. For example, failures (e.g., mechanical failures) can be addressed at a module or assembly level. The gradient coil cooling manifold assembly 64 is flexible and the manifolds 66 can be removed or pushed aside to provide access to the gradient coil assembly 60. The flexible nature of the gradient coil cooling assembly 64 also provides decoupling between the gradient's high frequency vibration and the manifold 66. Critical space (e.g., axial space 86 (see FIG. 3) between the manifold assembly 64 and the gradient coil assembly 60) is saved by matching the module's mainline geometry to that of the gradient coil assembly's circular shape and targeting the branches (e.g., secondary fluid passages 82) to their destination. In particular, as depicted in FIG. 4, the main fluid passage 79 of each manifold 66 is oriented to extend in a direction that is parallel with and aligned with the annular shape of the gradient coil assembly 60.

Figure 5:
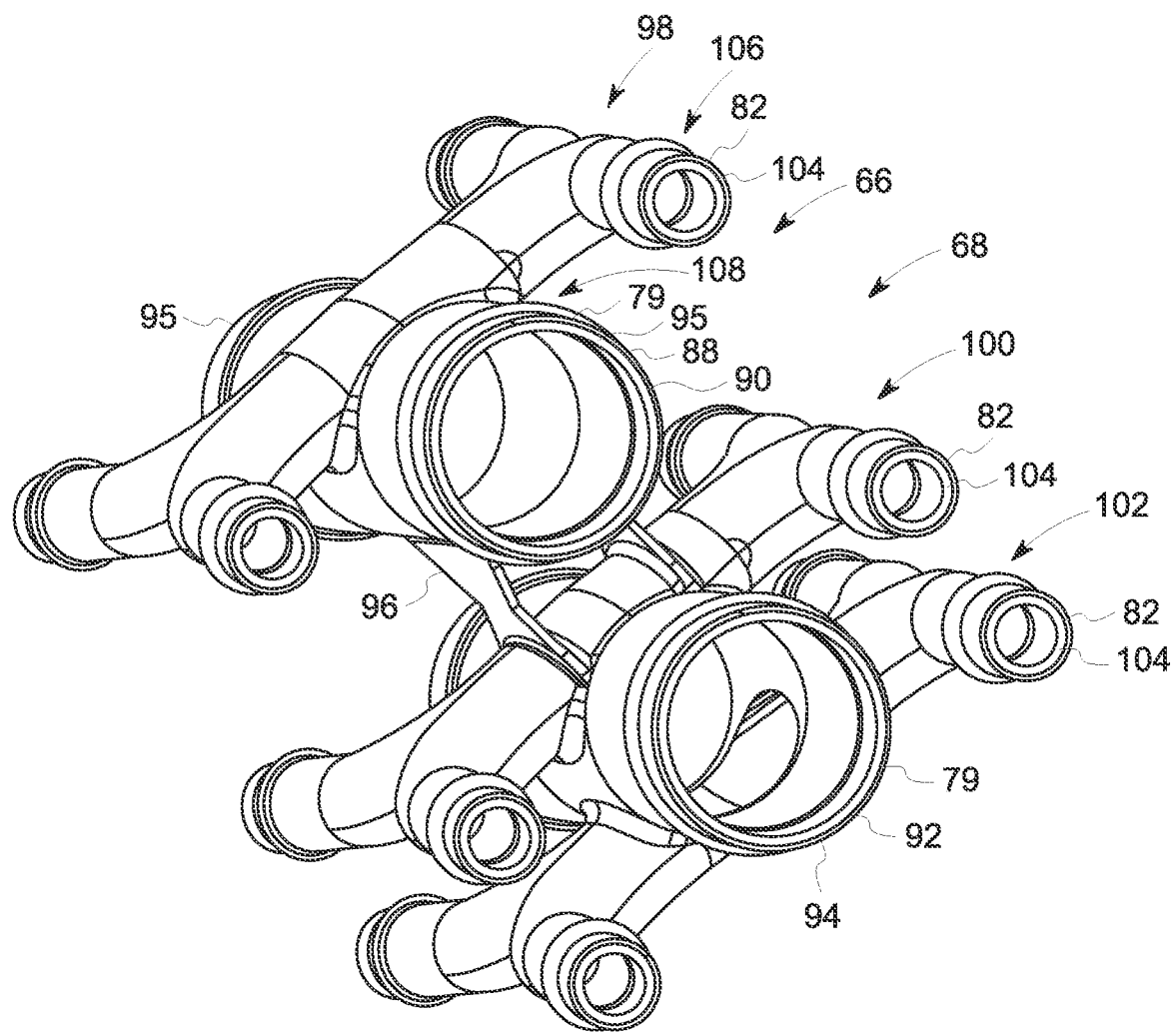
FIG. 5 is a perspective view of an embodiment of a manifold of the gradient coil cooling manifold assembly of FIG. 3 (e.g., having two main passages), in accordance with aspects of the present disclosure.
Figure 6:
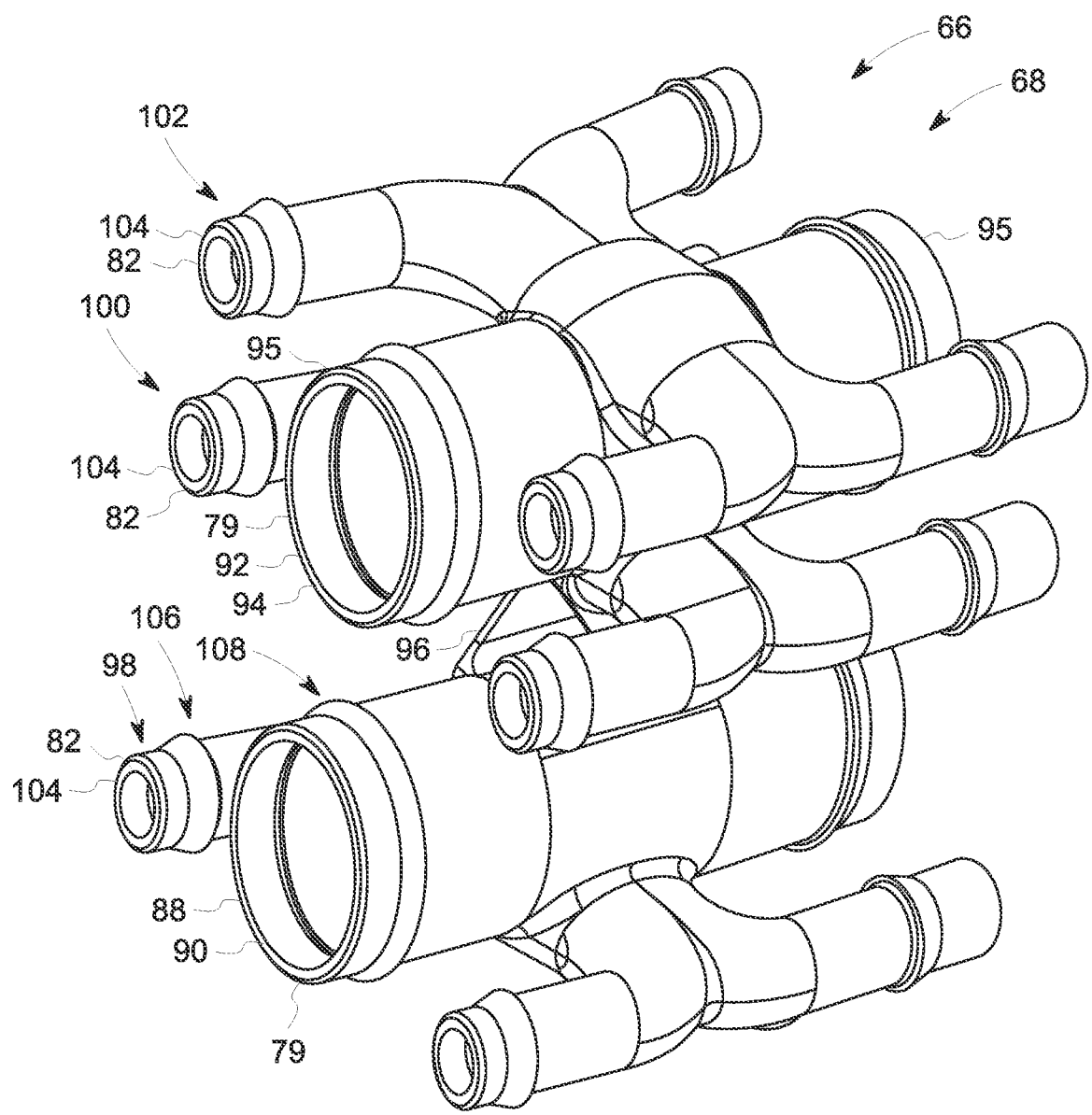
FIG. 6 is another perspective view of the manifold in FIG. 5, in accordance with aspects of the present disclosure.

FIGS. 5 and 6 are perspective views of an embodiment of the manifold 68 of the gradient coil cooling manifold assembly 64 of FIG. 3. The manifold 68 includes a first main or primary fluid passage 88 defined by a wall 90 and a second main or primary fluid passage 92 defined by a wall 94. Each main fluid passage 88, 92 is open on both ends 95. The walls 90 are coupled via structural ribs 96. As depicted, two structural ribs 96 extend between and connect the walls 90, 94. The number of structural ribs 96 may vary (e.g., 1, 2, 3, 4, etc.). The first main fluid passage 88 is configured to couple to the main supply line (e.g., main supply line 78 in FIG. 3). The second main fluid passage 92 is configured to couple to the main return line (e.g., main return line 80 in FIG. 3). The first main fluid passage 88 is fluidly coupled to a set 98 of secondary fluid passages 82 (which serve as secondary fluid supply lines coupled to the cooling chambers 65 within gradient coil assembly 60 in FIG. 2). An inner diameter of the wall 90 of the first main fluid passage 88 is greater than respective diameters of the respective walls 104 of the set 98 of secondary fluid passages 82. The second main fluid passage 90 is fluidly coupled to a first set 100 of secondary fluid passages 82 and a second set 102 of secondary fluid passages 82 (each of which serve as secondary fluid return lines coupled to the cooling chambers 65 within the gradient coil assembly 60 in FIG. 2). An inner diameter of the wall 94 of the second main fluid passage 92 is greater than respective diameters of the respective walls 104 of each secondary fluid passage 82 of the first set 100 and second set 102 of secondary fluid passages 82. As depicted, each set 98, 100, 102 of secondary fluid passages 82 includes 4 secondary fluid passages 82. Each set 98, 100, 102 on opposite sides includes 2 secondary fluid passages 82 that initially extend away from the main fluid passage 88 or 92 and then toward one of the ends 95 of the main fluid passage 88 or 92. Each set 98, 100, 102 includes 2 secondary fluid passages 82 branching towards one end 95 and 2 secondary passages 82 branching towards the opposite end 95.

Each secondary fluid passage 82 is defined by a respective wall 104. As depicted in FIGS. 5 and 6, an outer surface of each respective wall 104 forms a barb connector or fitting 106. An outer surface of each of the walls 90 and 94 also form barb connectors or fittings 108 at each end 95. Each barb connector 106, 108 enables interface with a respective rubber hose and the ability to retain pressurized fluid (e.g. water) via leak-tight connection. A combination of the orientation of the barbs on the outer surface of the barbed connectors 106, 108 and post-processing (e.g., via a vibratory finisher) after additive manufacturing enables the outer surface of the barbed connectors 106, 108 to be leak tight up to pressures of at least approximately 450 psi (3102 kPa) (which is 3× burst pressure of a pressure of approximately 150 psi (1034 kPa)).

Figure 7:
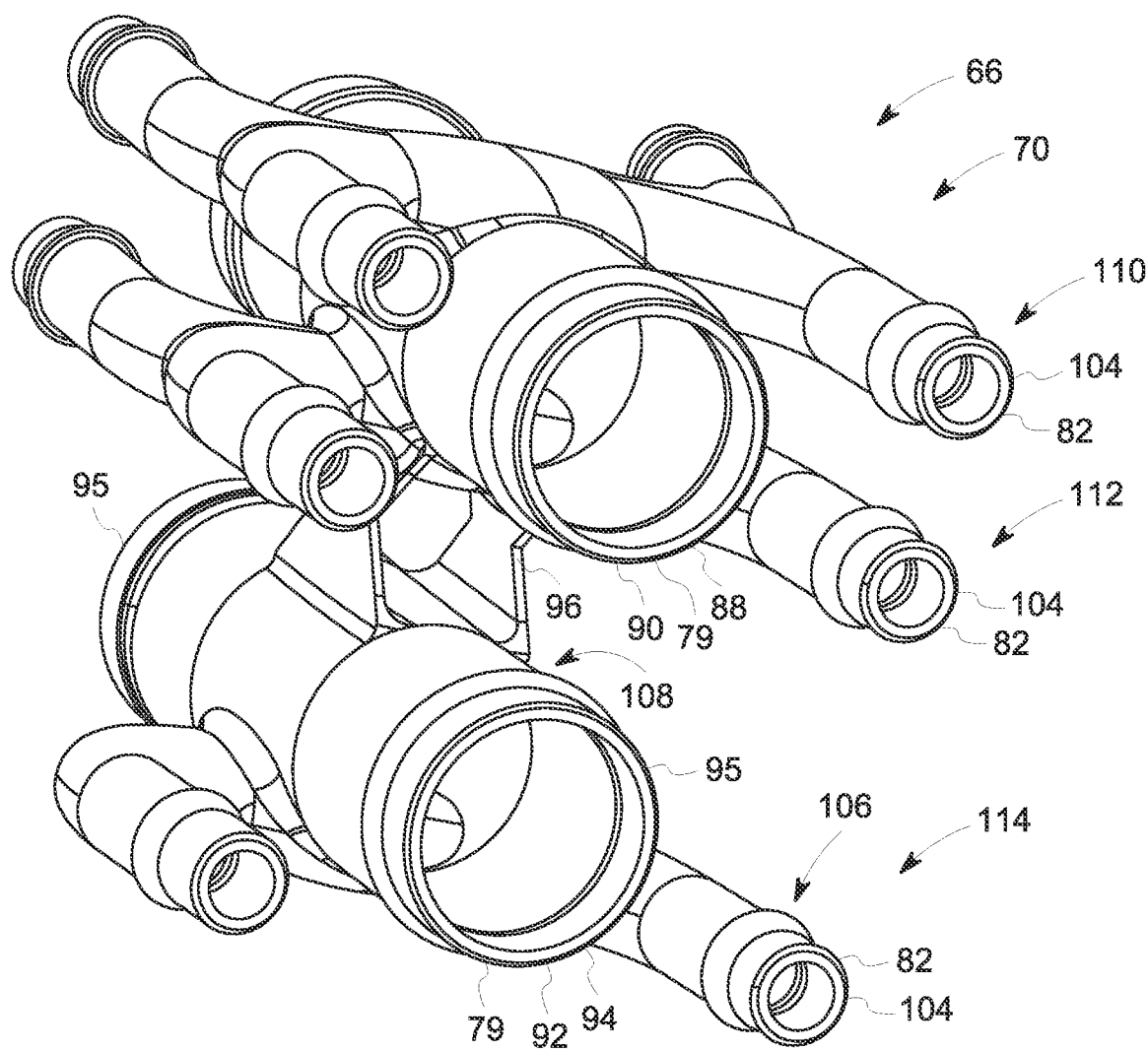
FIG. 7 is a perspective view of an embodiment of a manifold of the gradient coil cooling manifold assembly of FIG. 3 (e.g., having two main passages), in accordance with aspects of the present disclosure.

FIG. 7 is a perspective view of an embodiment of the manifold 70 of the gradient coil cooling manifold assembly 64 of FIG. 3. The manifold 70 includes a first main or primary fluid passage 88 defined by a wall 90 and a second main or primary fluid passage 92 defined by a wall 94. Each main fluid passage 88, 92 is open on both ends 95. The walls 90 are coupled via structural ribs 96. As depicted, two structural ribs 96 extend between and connect the walls 90, 94. The number of structural ribs 96 may vary (e.g., 1, 2, 3, 4, etc.). The first main fluid passage 88 is configured to couple to the main supply line (e.g., main supply line 78 in FIG. 3). The second main fluid passage 92 is configured to couple to the main return line (e.g., main return line 80 in FIG. 3). The first main fluid passage 88 is fluidly coupled to a first set 110 of secondary fluid passages 82 and a second set 112 of secondary fluid passages 82 (each of which serve as secondary fluid supply lines coupled to the cooling chambers 65 within the gradient coil assembly 60 in FIG. 2). An inner diameter of the wall 90 of the first main fluid passage 88 is greater than respective diameters of the respective walls 104 of each secondary fluid passage 82 of the first set 110 and the second set 112 of secondary fluid passages 82. The second main fluid passage 92 is fluidly coupled to a set 114 of secondary fluid passages 82 (which serve as secondary fluid return lines coupled to the cooling chambers 65 within the gradient coil assembly 60 in FIG. 2). An inner diameter of the wall 94 of the second main fluid passage 92 is greater than respective diameters of the respective walls 104 of each secondary fluid passage 82 of the set 114 of secondary fluid passages 82. As depicted, the sets 110 and 112 of secondary fluid passages 82 includes 4 secondary fluid passages 82 and the set 114 includes 2 secondary fluid passages 82. Each set 110 and 112 includes 2 secondary fluid passages 82 on opposite sides that initially extend away from the main fluid passage 88 and then toward one of the ends 95 of the main fluid passage 88. Set 114 includes 2 secondary fluid passages 82 that initially extend away from the main fluid passage 92 and then toward one end 95 of the main fluid passage 92. Each set 110 and 112 includes 2 secondary fluid passages 82 branching towards one end 95 and 2 secondary passages 82 branching towards the opposite end 95.

Each secondary fluid passage 82 is defined by a respective wall 104. As depicted in FIG. 7, an outer surface of each respective wall 104 forms a barb connector or fitting 106. An outer surface of each of the walls 90 and 94 also form barb connectors or fittings 108 at each end 95. Each barb connector 106, 108 enables interface with a respective rubber hose and the ability to retain pressurized fluid (e.g. water) via leak-tight connection. A combination of the orientation of the barbs on the outer surface of the barbed connectors 106, 108 and post-processing (e.g., via a vibratory finisher) after additive manufacturing enables the outer surface of the barbed connectors 106, 108 to be leak tight up to pressures of at least approximately 450 psi (3102 kPa) (which is 3× burst pressure of a pressure of approximately 150 psi (1034 kPa)).

Figure 8:
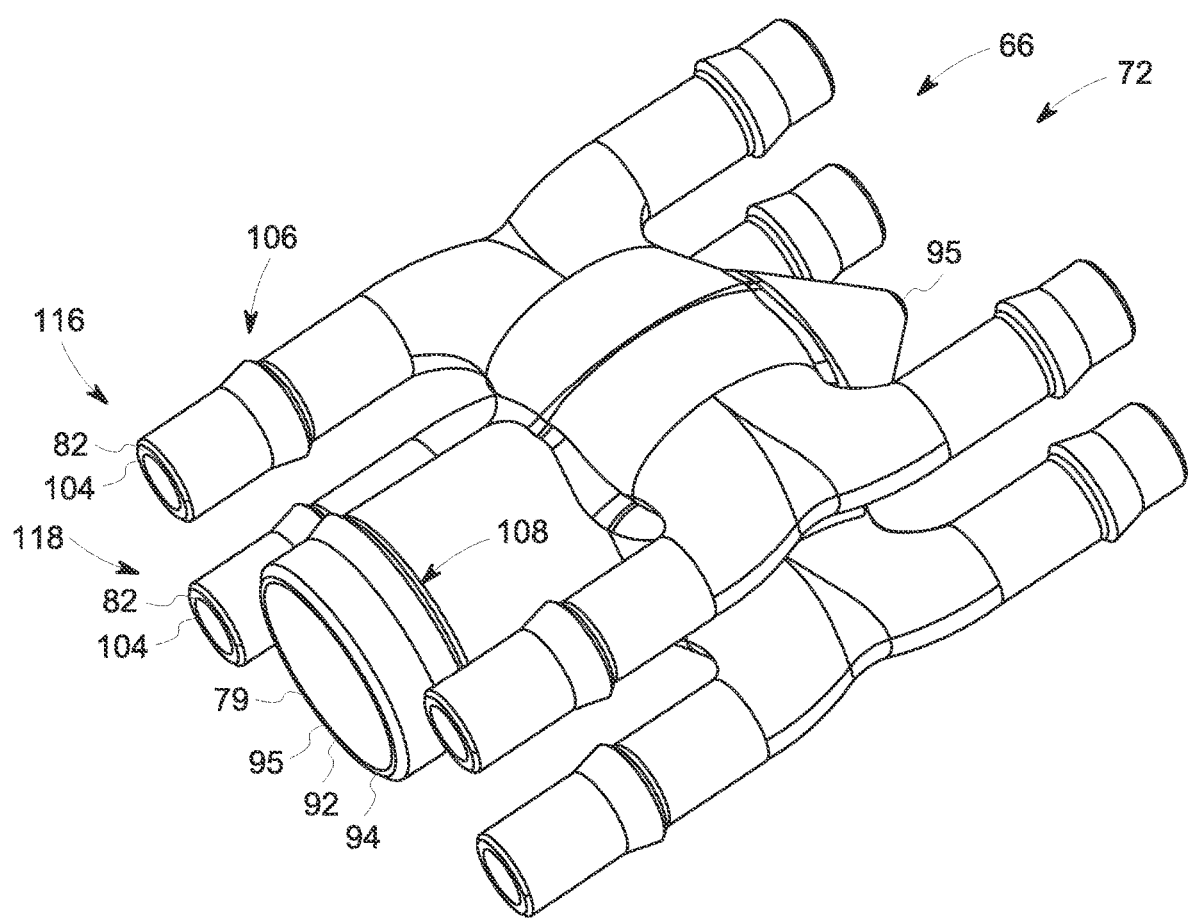
FIG. 8 is a perspective view of an embodiment of a manifold of the gradient coil cooling manifold assembly of FIG. 3 (e.g., having a single main passage), in accordance with aspects of the present disclosure.

FIG. 8 is a perspective view of an embodiment of the manifold 72 of the gradient coil cooling manifold assembly 64 of FIG. 3. The manifold 72 includes a single main or primary fluid passage 92 defined by a wall 94. The main fluid passage 92 is open on one end 95 and closed on the opposite end 95. The main fluid passage 92 is configured to couple to the main return line (e.g., main return line 80 in FIG. 3). The main fluid passage 92 is fluidly coupled to a first set 116 of secondary fluid passages 82 and a second set 118 of secondary fluid passages 82 (each of which serve as secondary fluid return lines coupled to the cooling chambers 65 within the gradient coil assembly 60 in FIG. 2). An inner diameter of the wall 94 of the main fluid passage 92 is greater than respective diameters of the respective walls 104 of each secondary fluid passage 82 of the first set 116 and the second set 118 of secondary fluid passages 82. As depicted, the sets 116 and 118 of secondary fluid passages 82 each include 4 secondary fluid passages 82. Each set 116 and 118 includes 2 secondary fluid passages 82 on opposite sides that initially extend away from the main fluid passage 88 and then toward one of the ends 95 of the main fluid passage 88. Each set 116 and 118 includes 2 secondary fluid passages 82 branching towards the open end 95 and 2 secondary passages 82 branching towards the closed end 95.

Each secondary fluid passage 82 is defined by a respective wall 104. As depicted in FIG. 8, an outer surface of each respective wall 104 forms a barb connector or fitting 106. An outer surface of the wall 94 forms a barb connector or fitting 108 on the open end 95. Each barb connector 106, 108 enables interface with a respective rubber hose and the ability to retain pressurized fluid (e.g. water) via leak-tight connection. A combination of the orientation of the barbs on the outer surface of the barbed connectors 106, 108 and post-processing (e.g., via a vibratory finisher) after additive manufacturing enables the outer surface of the barbed connectors 106, 108 to be leak tight up to pressures of at least approximately 450 psi (3102 kPa) (which is 3× burst pressure of a pressure of approximately 150 psi (1034 kPa)).

Figure 9:
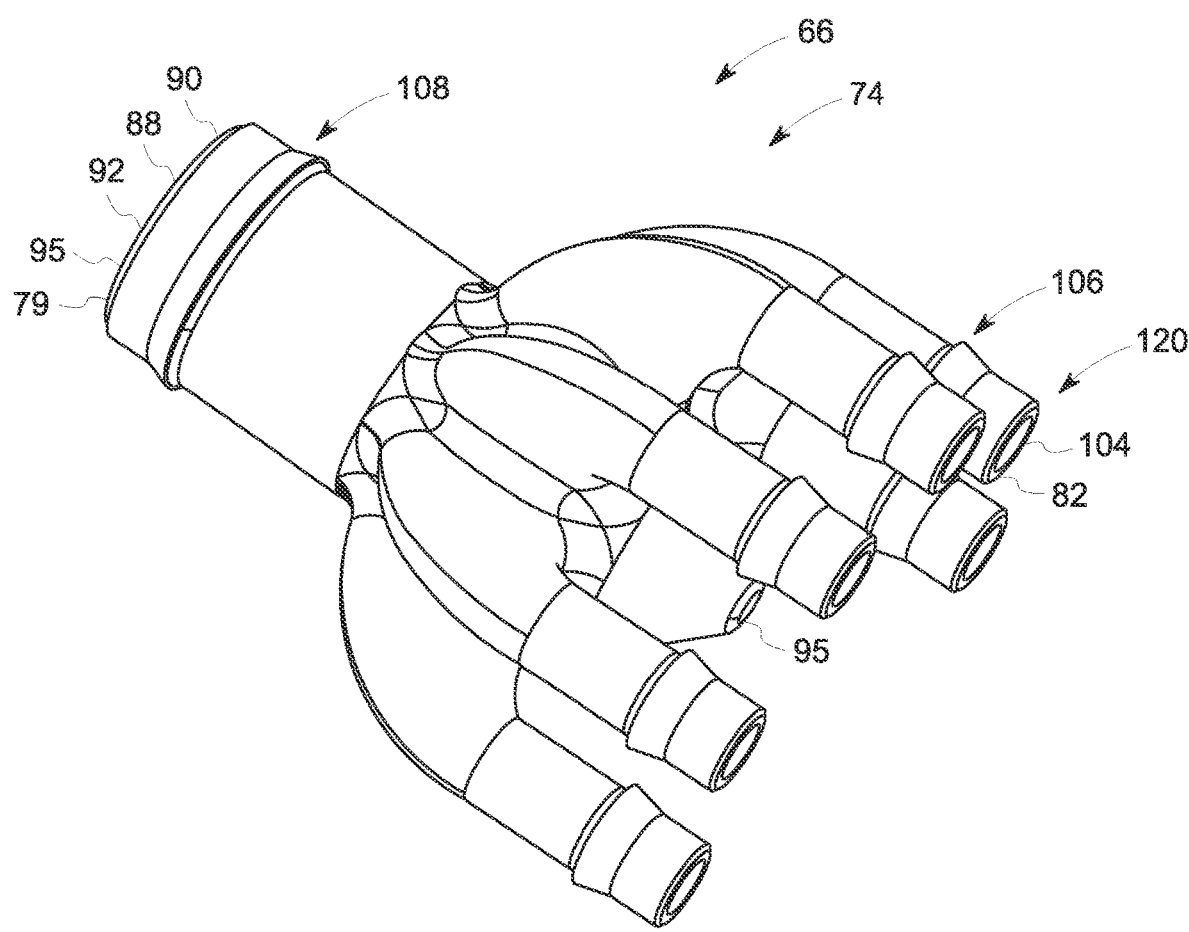
FIG. 9 is a perspective view of an embodiment of a manifold of the gradient coil cooling manifold assembly of FIG. 3 (e.g., having a single main passage), in accordance with aspects of the present disclosure.

FIG. 9 is a perspective view of an embodiment of the manifold 74 of the gradient coil cooling manifold assembly 64 of FIG. 3. The manifold 74 includes a single main or primary fluid passage 88 defined by a wall 90. The main fluid passage 88 is open on one end 95 and closed on the opposite end 95. The main fluid passage 88 is configured to couple to the main supply line (e.g., main supply line 78 in FIG. 3). The main fluid passage 88 is fluidly coupled to a set 120 of secondary fluid passages 82 (each of which serve as secondary fluid supply lines coupled to the cooling chambers 65 within the gradient coil assembly 60 in FIG. 2). An inner diameter of the wall 90 of the main fluid passage 88 is greater than respective diameters of the respective walls 104 of each secondary fluid passage 82 of the set 120 of secondary fluid passages 82. As depicted, the set 120 of secondary fluid passages 82 includes 6 secondary fluid passages 82 circumferentially distributed about and extending toward the closed end 95 of the main fluid passage 88.

Each secondary fluid passage 82 is defined by a respective wall 104. As depicted in FIG. 9, an outer surface of each respective wall 104 forms a barb connector or fitting 106. An outer surface of the wall 90 forms a barb connector or fitting 108 on the open end 95. Each barb connector 106, 108 enables interface with a respective rubber hose and the ability to retain pressurized fluid (e.g. water) via leak-tight connection. A combination of the orientation of the barbs on the outer surface of the barbed connectors 106, 108 and post-processing (e.g., via a vibratory finisher) after additive manufacturing enables the outer surface of the barbed connectors 106, 108 to be leak tight up to pressures of at least approximately 450 psi (3102 kPa) (which is 3× burst pressure of a pressure of approximately 150 psi (1034 kPa)).

Technical effects of the disclosed embodiments include providing a gradient coil cooling manifold assembly that includes one or more additively manufactured manifold modules. The additively manufactured manifold modules include complex geometries that enable them to be optimized to produce maximum flow with minimal volumetric space, efficient fabrication, assembly, and service ability. Critical space (e.g., axial space between the manifold assembly and the gradient coil assembly) is saved by matching the module's mainline geometry to that of the gradient coil's circular shape and targeting the branches to their destination. Fabricating this complex geometry would be substantially more difficult with traditional module fabrication techniques. Additive manufacturing allows combining otherwise separate components into a single part enable to withstand the system parameters for cooling a gradient coil assembly of a MRI system. The disclosed embodiments enable less connections in the manifold assembly, thus, lowering the risk of leaks. In addition, less braze joints/fittings enables a lower risk of mechanical failure in the manifold assembly. Further, the custom precise geometry enables better cooling with fewer failures. Even further, the disclosed embodiments enable a lower cost manifold assembly.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

This written description uses examples to disclose the present subject matter, including the best mode, and also to enable any person skilled in the art to practice the subject matter, including making and using any devices or systems and performing any incorporated methods. The patentable scope of the subject matter is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A cooling system for cooling a gradient coil assembly of a magnetic resonance imaging (MRI) system, comprising:
   a gradient coil cooling manifold assembly, comprising:
      a plurality of hoses; and
      a plurality of additively manufactured manifolds coupled to the plurality of hoses, wherein each additively manufactured manifold of the plurality of additively manufactured manifolds comprises:
         a main fluid passage defined by a wall and having a first longitudinal end and a second longitudinal end; and
         a set of secondary fluid passages coupled to the main fluid passage and defined by respective walls, wherein the wall of the main fluid passage and the respective walls of the set of secondary fluid passages form respective barb connectors configured to couple to respective hoses of the plurality of hoses, and wherein the respective walls of the set of secondary fluid passages are each directly coupled to the wall of the main fluid passage, and the respective barb connectors formed by the respective walls of the set of secondary fluid passages form barb connectors that initially extend away from the main fluid passage and then extend toward one of the first longitudinal end or the second longitudinal end of the main fluid passage; and a cooling cabinet coupled to the gradient coil cooling manifold assembly and configured to provide liquid coolant to the gradient coil cooling manifold assembly.

2. The cooling system of claim 1, wherein each additively manufactured manifold of the plurality of additively manufactured manifolds is formed as a single integral piece.

3. The cooling system of claim 1, wherein the gradient coil cooling manifold assembly is configured to couple to a gradient coil assembly having an annular shape.

4. The cooling system of claim 3, wherein the main fluid passage is oriented to extend in a direction that is parallel with the annular shape of the gradient coil assembly when the gradient coil cooling manifold assembly is coupled to the gradient coil assembly.

5. The cooling system of claim 3, wherein a flexibility of the gradient coil cooling manifold assembly is configured to decouple the gradient coil mailed Jul. 13, 2023 cooling manifold assembly from mechanical vibrations of the gradient coil assembly when coupled the gradient coil cooling manifold assembly is coupled to the gradient coil assembly.

6. A magnetic resonance imaging (MRI) system, comprising:

a gradient coil assembly having an annular shape and comprising a plurality of gradient coils;

a gradient coil cooling manifold assembly configured to couple to the gradient coil assembly and to regulate a temperature of the gradient coil assembly, wherein the gradient coil cooling manifold assembly comprises a plurality of manifolds, wherein each manifold of the plurality of manifolds comprises:

a main fluid passage defined by a wall and having a first longitudinal end and a second longitudinal end; and a set of secondary fluid passages coupled to the main fluid passage and defined by respective walls, wherein the wall of the main fluid passage and the respective walls of the set of secondary fluid passages form respective barb connectors configured to couple to respective hoses, and the respective barb connectors formed by the respective walls of the set of secondary fluid passages form barb connectors that initially extend away from the main fluid passage and then extend toward one of the first longitudinal end or the second longitudinal end of the main fluid passage;

wherein each manifold of the plurality of manifolds is formed as a single integral piece, and wherein the main fluid passage of each manifold of the plurality of manifolds is oriented to extend in a direction that is parallel with the annular shape of the gradient coil assembly when the gradient coil cooling manifold assembly is coupled to the gradient coil assembly.

7. The MRI system of claim 6, wherein each manifold of the plurality of manifolds is additively manufactured.

8. The MRI system of claim 6, wherein respective outer surfaces of the respective walls of the set of secondary fluid passages are configured to be leak tight to pressures greater than approximately 3102 kilopascals when coupled to the respective hoses.

* * * * *